United States Patent [19]
Tanaka et al.

[11] Patent Number: 4,897,815
[45] Date of Patent: Jan. 30, 1990

[54] HIGH-SPEED WRITE TYPE NONVOLATILE SEMICONDUCTOR MEMORY

[75] Inventors: Sumio Tanaka, Tokyo; Shinji Saito, Yokohama; Shigeru Atsumi, Tokyo; Nobuaki Ohtsuka, Yokohama, all of Japan

[73] Assignee: Kabushiki Kaisha Toshiba, Kawasaki, Japan

[21] Appl. No.: 96,458

[22] Filed: Sep. 15, 1987

[30] Foreign Application Priority Data

Dec. 24, 1986 [JP] Japan .................................. 61-306306

[51] Int. Cl.$^4$ ............................................. G11C 11/40
[52] U.S. Cl. ..................................... 365/148; 365/154; 365/230.06; 357/23.1
[58] Field of Search ........... 365/148, 154, 189, 189.01, 365/189.04, 230.01, 230.06; 357/45, 23.1

[56] References Cited

U.S. PATENT DOCUMENTS

3,618,052 11/1971 Kwei .................................. 365/154

OTHER PUBLICATIONS

IBM Tech. Dis. Bul., vol. 17, No. 11, Apr. 1975, "Programable Memory Circuits", I. T. Ho et al, p. 3279.
Japanese Patent Disclosure (Kokai) No. 59-77700, M. Momodomi et al., May 4, 1984.

Primary Examiner—Terrell W. Fears
Attorney, Agent, or Firm—Finnegan, Henderson, Farabow, Garrett and Dunner

[57] ABSTRACT

A nonvolatile semiconductor memory of this invention is obtained by dividing a memory cell array in which EPROM cells are provided in a matrix form and a write circuit into a plurality of blocks, commonly connecting sources of cell transistors in each block of the memory cell array, and connecting the common source of each block to a ground node through a corresponding resistive component.

23 Claims, 6 Drawing Sheets

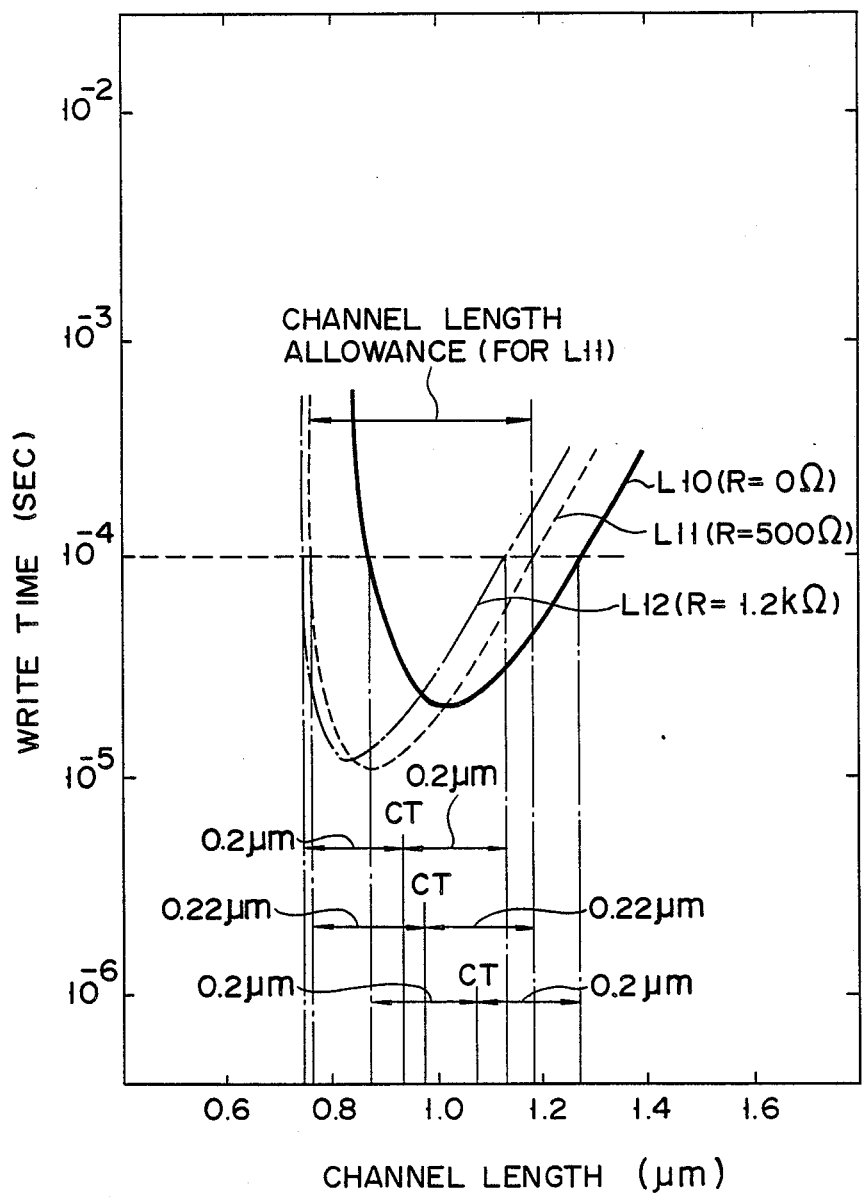
F I G. 5

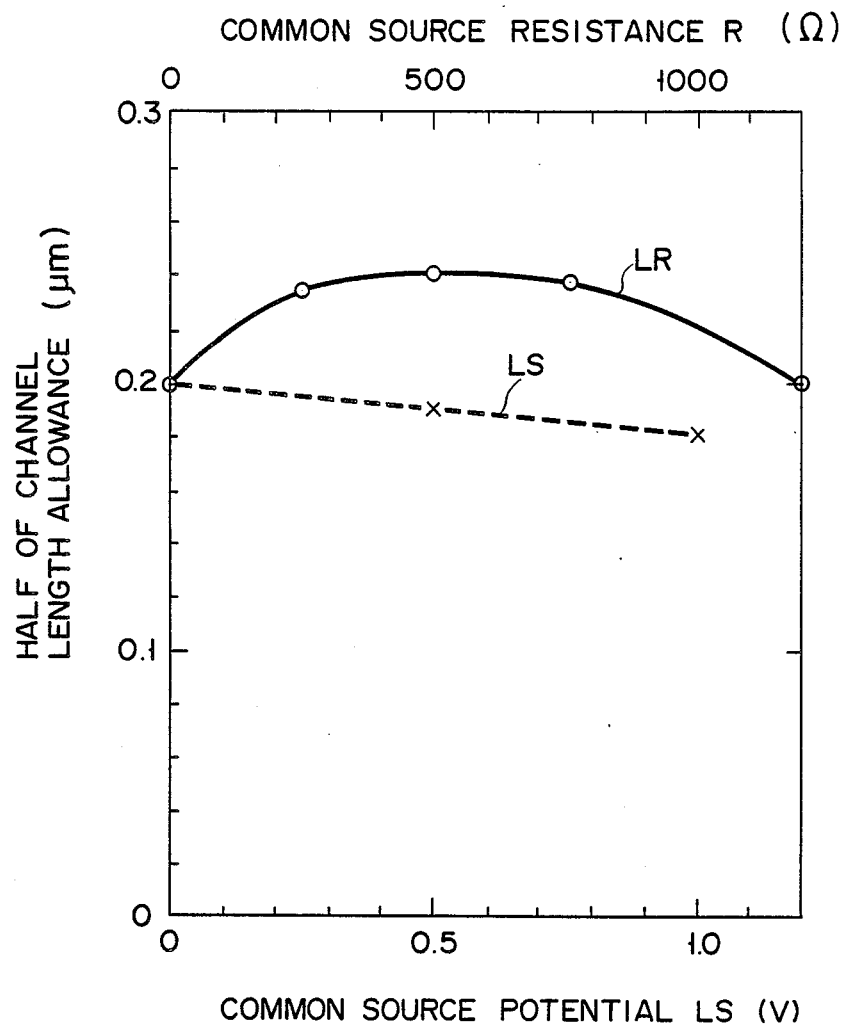
F I G. 6 under HIGH-SPEED WRITE TYPE NONVOLATILE SEMICONDUCTOR MEMORY

BACKGROUND OF THE INVENTION

The present invention relates to a nonvolatile semiconductor memory and, more particularly, to an improvement in an ultraviolet ray erasable and programmable read-only memory (to be referred to as an EPROM hereinafter).

FIG. 1 shows a sectional structure of a memory cell transistor constituting an EPROM cell. In FIG. 1, reference numeral 41 denotes a semiconductor substrate (e.g., a p$^-$-type silicon substrate); 42, an n$^+$-type source region; 43, an n$^+$-type drain region; 44, a first gate insulating film; 45, a floating gate; 46, a control gate; and 47, a second gate insulating film. In this cell, when a high voltage is applied between regions 43 and 42 and between substrate 41 and gate 46, electrons e$^-$ of high energy accelerated by a high electric field between the drain and the source are attracted by gate 45 of a positive potential and injected therein, thereby writing data. Note that when no high voltage is applied to region 43 or 46, injection of electrons does not occur. The number of injected electrons (write amount) is linearly increased due to an increase in electric field in a channel direction when an effective channel length of the memory cell transistor is shortened.

FIG. 2 shows an equivalent circuit in which an EPROM cell transistor having the arrangement shown in FIG. 1 is applied to a memory cell array arranged in a matrix of 1024 rows × 1024 columns. One of cell transistors (MC1, MC2, ..., MC1024) of one column of this array is selected to write data using a write control transistor (TP). That is, the respective drains of cell transistors MC1, MC2, ..., are commonly connected to bit line BL, and line BL is connected to sense amplifier SA. MOS transistor TP (an equivalent resistor of which in an ON state is represented by Rp in FIG. 2), which is switched by read/write control signal $\overline{R/W}$, is connected between line BL and node WN to which write voltage Vpp is applied. The respective sources of transistors MC1, MC2, ... are commonly connected and then directly connected to ground node GN, and different selection signals SS1, SS2, ... are supplied to the respective gates thereof.

The following discussion assumes that transistor MC1 is selected and other transistors MC2 to MC1024 are not selected. When an effective channel length of each cell transistor is shortened, the degree of capacitive coupling between region 43 and gate 45 is relatively increased, and a floating gate potential of each of nonselected transistors MC2 to MC1024 is increased. When this potential exceeds a gate threshold voltage of the cell transistor when viewed from the floating gate, a small cell current begins to flow between the drain and the source of the non-selected cell transistor, and a punch through state occurs due to the capacitive coupling. In this case, although the current flowing through one non-selected cell transistor is small, a total current of all the non-selected cell transistors is very large and cannot be neglected in a large-capacity EPROM. The resistance of resistor Rp in an ON state of transistor TP is about 1 kΩ. Therefore, assuming that the cell current of each non-selected cell transistor is 1 μA, the total cell current of the 1023 non-selected cell transistors is about 1 mA, and when this current of 1 mA flows through resistor Rp, a drain voltage of transistor MC1 is less than voltage Vpp by about 1 V. As a result, a write speed is undesirably decreased.

As is apparent from the above description, a write speed of the cell transistor has an optimal value with respect to an effective channel length of the transistor. This is represented by solid line L1 in FIG. 3 as a result of simulation performed for a typical cell structure. In order to obtain write time 100 μs (10$^{-4}$ sec) or less, a channel length has an allowance (allowable variation width) of ±0.2 μm (a central value of which is about 1.07 μm).

In order to increase the above channel length allowance, an ion implantation dose for controlling the gate threshold voltage of the cell transistor may be increased. Dotted line L2 of FIG. 3 represents a simulation result of a cell, an ion implantation dose of which is increased by, e.g., 25% more than the cell represented by line L1 in FIG. 3. In this cell, in order to obtain a write L. time of 100 μs, the channel length has an allowance of ±0.24 μm.

The increased allowance of the channel length of the cell transistor represented by line L2 results from improved electron injection efficiency when the channel length is larger than the central value (~1.07 μm). A punch through withstand voltage is increased by an increase in a threshold voltage when the value of the channel length is smaller than the central value.

However, in order to adjust the ion implantation dose of the cell to increase the allowance of the channel length, ion implantation must be performed for the cell and an element of a cell peripheral circuit in different steps, so that an additional photoetching step is undesirably performed. In addition, adjustment of the ion implantation dose leads to a decrease in cell current and/or an increase in capacitance of the bit line, thereby increasing an access time of the memory cell.

SUMMARY OF THE INVENTION

It is, therefore, an object of the present invention to provide a nonvolatile semiconductor memory capable of increasing an allowable variation width of a channel length of a cell transistor when a write time of a cell must be decreased below a predetermined time without increasing an ion implantation dose of the cell transistor.

According to the nonvolatile semiconductor memory of the present invention, a memory cell array obtained by arranging cells in a matrix form and a write circuit are divided into a plurality of blocks, sources of cell transistors are commonly connected in the respective blocks of the memory cell array, and the common sources of the blocks are connected to a ground node respectively through resistors.

In the above arrangement, if the electron injection efficiency of a cell is low because a channel length of a cell transistor is large, each cell current is low, so that a common source potential of each cell block is relatively low. As a result, a write voltage is not substantially reduced. For this reason, degradation in a write speed of a selected cell is negligable. When the channel length is small, each cell current is increased, so that the common source potential is relatively high. In this case, however, since the electron injection efficiency of the cell is high, a substantially sufficient drain-source voltage of the selected cell transistor can be assured. Thus, according to an EPROM of the present invention, a channel length range allowing writing at a speed higher than a predetermined speed is increased.

Therefore, in order to set a write time of the cell to be shorter than a predetermined time, an allowance (allowable variation width) of the channel length of the cell transistor can be increased without performing different ion implantation steps for the cell transistor and to its peripheral circuit at doses higher than a normal value.

BRIEF DESCRIPTION OF THE DRAWINGS

FIG. 5 is a graph showing a simulation result of a relationship between a write time of a selected memory cell and a channel length of the memory cell in the memory shown in FIG. 4;

FIG. 6 is a graph showing a simulation result of a relationship between a common source resistor of each cell block and a channel length allowance of a memory cell transistor when a write time of a selected memory cell in the memory shown in FIG. 4 is decreased below a predetermined time;

DETAILED DESCRIPTION OF THE PREFERRED EMBODIMENT

Figure 1:
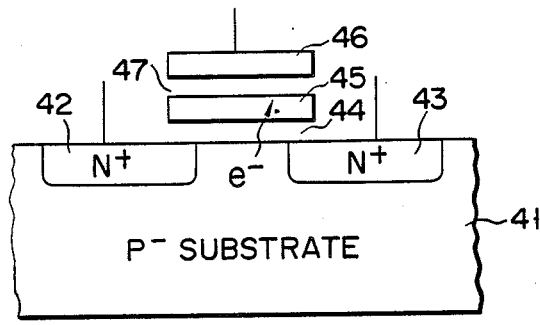
FIG. 1 is a sectional view showing an example of an arrangement of a cell transistor of an EPROM.
Figure 2:
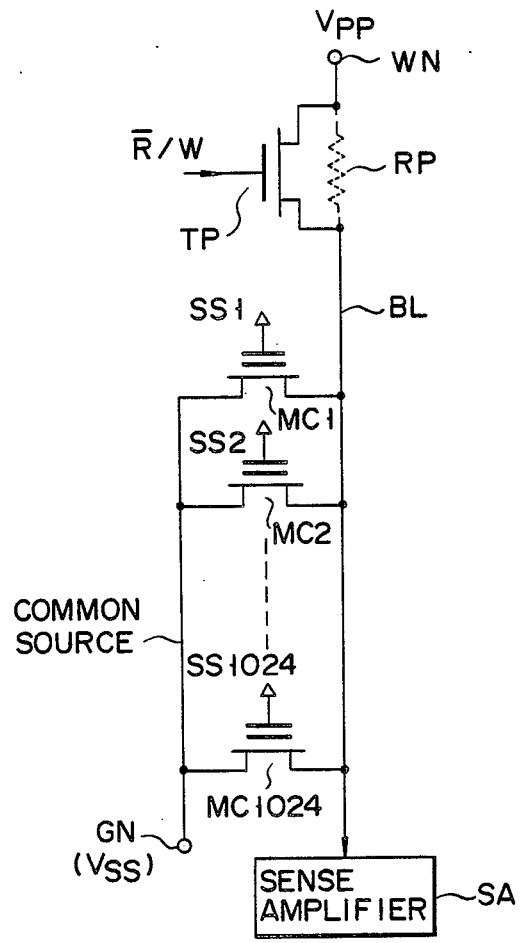
FIG. 2 is a circuit diagram showing an equivalent circuit in a write mode of a cell and a write circuit of one column in a memory cell array of the EPROM.
Figure 4:
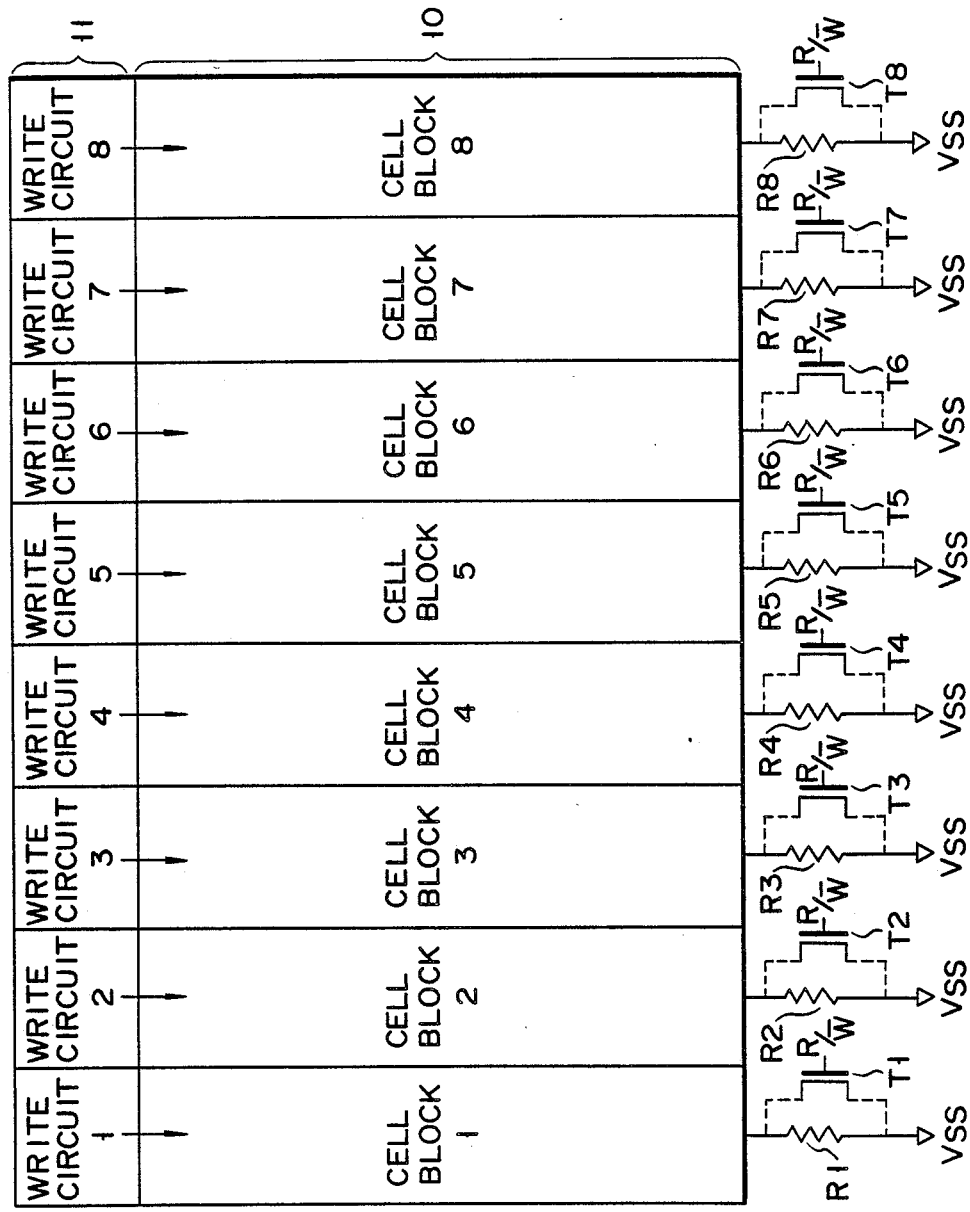
FIG. 4 is a circuit diagram showing a main part of an embodiment of a nonvolatile semiconductor memory of the present invention.

An embodiment of the present invention will be described in detail with reference to the accompanying drawings. FIG. 4 shows part of a 1 M-bit EPROM consisting of, e.g., 256 Kwords×8 bits. Reference numeral 10 denotes a memory cell array in which EPROM cells are arranged in a matrix of 1024 rows×1024 columns. The 1024 columns are divided into 8 cell blocks (sections) 1 to 8 each having 128 columns in correspondence to an 8-bit output. Reference numeral 11 denotes write circuits each provided in each column of array 10 and divided into write circuit blocks 1 to 8 corresponding to 8 cell blocks 1 to 8. If cells and write circuits of one column are taken out therefrom and a write state with respect to one cell is represented by an equivalent circuit, the result is as shown in FIG. 2.

In this embodiment, sources of all the cells in each of 8 cell blocks 1 to 8 are commonly connected, and the respective common sources are connected to ground nodes (Vss) through resistors R1 to R8 so that the respective common sources of cell blocks 1 to 8 are separated and do not interfere with each other. A resistance of each of resistors R1 to R8 is 500 Ω and can be achieved by a polysilicon resistor, a diffusion layer after ion implantation, and the like. Since this resistance is substantially linear, potentials of the common sources of cell blocks 1 to 8 are increased respectively as a current value of the cell is increased. Note that resistors R1 to R8 may include a nonlinear resistive component such as a series circuit of a diode and a resistor.

In the above EPROM, when writing is performed with respect to one column in cell blocks 1 to 8, one of 1024 cells in one column is selected and other 1023 cells are not selected. In this case, since a source potential proportional to a cell current is generated, the punch through phenomenon of the nonselected cells is restricted.

That is, when a channel length of a cell transistor is large and electron injection efficiency of a cell is low, current values of the selected cell and the non-selected cells are low. Therefore, a voltage drop caused by resistors R1 to R8 of cell blocks 1 to 8 is small, and a potential of the common sources of cell blocks 1 to 8 is relatively low. For this reason, if the effective channel length is set to be an optimal value (near the minimum point of a curve in FIG. 5) with respect to a write speed of the cell, a drain-source voltage of a selected cell transistor is rarely decreased by a low potential of the common sources, so that a decrease in write speed of the selected cell can be neglected. On the contrary, when the channel length of the cell transistor is small, the cell current is increased, and the potential of the common sources is relatively high. In this case, since the electron injection efficiency of the cell is increased, a sufficient drain-source potential of the selected cell transistor can be assured even if the potential of the common sources is more or less high, and a channel length area where writing can be performed at a predetermined speed (e.g., $10^4$ bps or more) or more is increased.

Figures 7A, 7B, 7C, 7D:
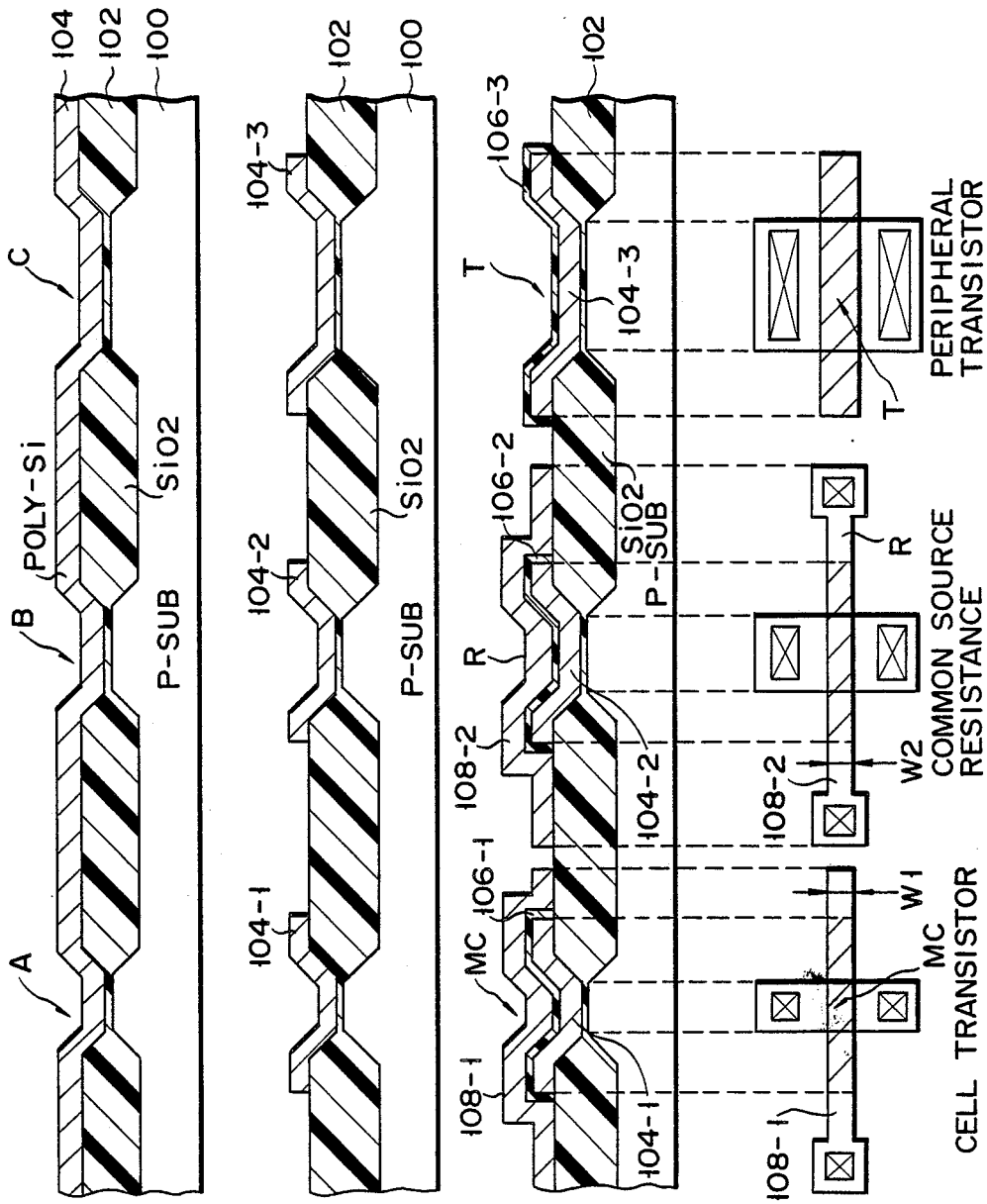
FIGS. 7A to 7C are cross-sectional views showing manufacturing steps of one of cell transistors (MC), a common source resistor (R), and a peripheral switching transistor (T) in the cell block shown in FIG. 4.
FIG. 7D is a plan view when the sectional structure of FIG. 7C is viewed from above.

FIGS. 7A to 7C are sectional views of a semiconductor structure of part of the cell block (1) shown in FIG. 4.

In FIG. 7A, prospective element formation regions A, B, and C surrounded by thick field region 102 are formed on p-type substrate 100. Polysilicon layer 104 is deposited on region 102. Layer 104 is patterned using a predetermined pattern mask to form polysilicon floating gate 104-1 and the like of a memory cell transistor (MC), as shown in FIG. 7B. (Polysilicon layer 104-3 serves as, e.g., a gate of switching transistor T.)

A thin silicon oxide film is formed on layers 104-1 to 104-3 and then patterned using a predetermined mask pattern, thereby forming silicon oxide film regions 106-1 to 106-3 shown in FIG. 7C.

Thereafter, a second polysilicon layer is deposited on regions 106-1 to 106-3 using a predetermined mask pattern. This polysilicon layer is patterned using a predetermined mask pattern to simultaneously form polysilicon control gate 108-1 and resistor layer 108-2 to serve as a common source resistor (R) of the memory cell transistor (MC), as shown in FIG. 7C.

FIG. 7D is a plan view when the sectional structure of FIG. 7C is viewed from above. When a mask pattern of the second polysilicon layer is determined, width W1 of gate 108-1 and width W2 of common source resistor layer 108-2 are automatically determined. When width W1 of gate 108-1 is determined, a channel width of the cell transistor (MC) is automatically determined. (In this embodiment, W1=W2. However, using k as a given coefficient, a mask pattern which gives W1=kW2 may be used.)

A simulation result of a relationship between the channel length of the cell transistor and a write time obtained when the above arrangement is used and resistors R1 to R8 of, e.g., 500 Ω are inserted between the common sources and the ground nodes (Vss) of cell blocks 1 to 8 is represented by broken line L11 in FIG. 5. Note that in FIG. 5, alternate long and dashed line L12 represents a simulation result obtained when common source resistors R1 to R8 ( R) are 1.2 kΩ. In addition, solid line L10 represents a simulation result obtained when the common source is directly connected to the ground node (R=0 Ω) and corresponds to the characteristics of the typical example represented by solid line L1 in FIG. 3.

Figure 3:
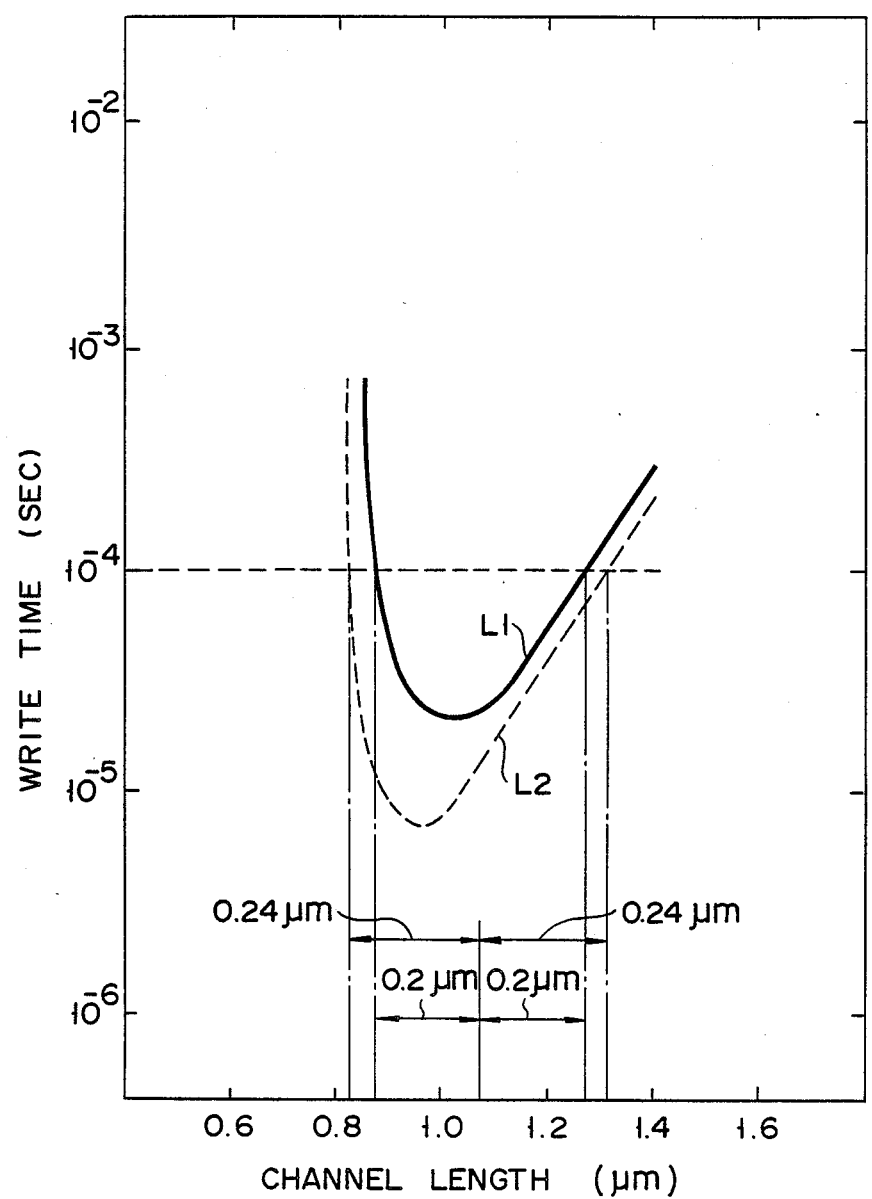
FIG. 3 is a graph showing a simulation result of a relationship between a write time of a selected memory cell and a channel length of the memory cell in a conventional EPROM.

From the above simulation results, it is found that when a resistance of resistor R (R1 to R8) provided in each cell block is properly selected, a write time shortening effect, substantially the same as that of the simulation result represented by broken line L2 in FIG. 3 and obtained when the ion implantation dose is increased to be 25% larger than that of the prior art, can be obtained without increasing an ion implantation dose of the cell larger than a normal value. In addition, according to the simulation results shown in FIG. 5, center CT of the effective channel length of the cell transistor is shifted so as to decrease the channel length by about 0.1 μm as compared with the simulation result (L10) of the prior art. Therefore, from this speed reading.

When resistor R (common source resistors R1 to R8) connected to the common source as described above is formed by the same material (polysilicon of the second layer) as that of the control gate of the cell transistor and formed to have a width (e.g., the same width W1=W2 as shown in FIG. 7D) corresponding or proportional to the channel width of the cell transistor, the following advantages can be obtained. That is, when the channel width (W1) of the cell transistor is increased larger than a predetermined central value (CT in FIG. 5), a writing limitation region of the cell begins (i.e., a writing speed is decreased), so that the resistance of resistor R is preferably minimized. In this case, the resistance of resistor R is actually decreased by a value corresponding to an increase in width of the resistor layer. When the channel width (W1) of the cell is made smaller than the central width (CT), a punch through limitation region begins (i.e., the drain voltage is decreased), so that a higher resistance of resistor R is better. In this case, the value of resistor R is actually increased by a value corresponding to a decrease in the width of the resistor layer.

When resistor R is formed to have the same width as that of the channel width of the control gate of the cell transistor as described above, assume that a writing time of the cell is to be 100 μs or less. Solid line LR in FIG. 6 shows a simulation result of obtaining ½ of a channel length allowance of the cell with respect to the value of resistor R (R1 to R8) and to a potential (common source potential) generated when a current of 1 mA of nonselected cells flows through the resistor. According to the above simulation result, it is found that when the resistance of resistor R (R1 to R8) varies about +25% from 500 Ω, the channel length allowance (about 0.22 μm) does not change significantly.

On the contrary, broken line LS in FIG. 6 shows a simulation result obtained when the common source potential is set at a constant potential higher than the ground potential. In this case, it is found that the channel length allowance is decreased (0.2 μm or less) as the common source potential is increased. In addition, when the above constant potential is to be generated by a constant voltage circuit combining transistors, a potential change tends to occur due to a change in parameters of the transistors of the constant voltage circuit or variations in the power source voltage.

Note that during a reading operation of the above memory, the resistance of resistor R connected to the common source is preferably decreased, since the drain voltage of the selected cell transistor is low and the punch through withstand voltage is high. For this purpose, a switching element consisting of MOS transistor T (T1 to T8) may be provided in parallel with resistor R (R1 to R8) as represented by dotted lines in FIG. 4, and transistor T is turned on during the read operation (R=logic "1") to short-circuit resistor R (R1 to R8).

As has been described above, according to the nonvolatile semiconductor memory of the present invention, the memory cell array and the write circuit are divided into a plurality of blocks, and the common sources of the respective blocks are connected to the ground nodes respectively through the resistors. Therefore, in order to set the write time of the selected cell shorter than the predetermined time, the channel length allowance of the cell transistor (an allowable width of variation in the channel length during manufacture) can be increased. In this case, since an ion implantation dose of the cell need not be increased, ion implantation of the cell and its peripheral circuit can be performed in a single step. As a result, the number of photoetching steps (patterning steps) is not increased, the cell current is not decreased or a capacitance of the bit line is not increased, and the access time is not prolonged.

What is claimed is:

1. A nonvolatile semiconductor memory comprising:
   a memory cell array divided into a plurality of blocks, each of said divided blocks including data memory cell MOS transistors arranged in a matrix form and write circuits for sending write data to said cell MOS transistors; and
   resistive elements, each resistive element included in only one of the blocks in said plurality of blocks, for connecting sources of said cell MOS transistors commonly connected in each of said plurality of blocks to one end of a power circuit of said memory.

2. A memory according to claim 1, wherein each of said cell MOS transistors include a control gage electrode having a gate width and wherein a width of each of said resistive elements corresponds to said width of said control gate electrode.

3. A memory according to claim 1, wherein each of said cell MOS transistors includes a control gate electrode and a channel having a channel width, and wherein each said resistive element has a width corresponding to said channel width and is formed of the same material as that of said control gate electrode.

4. A memory according to claim 1, wherein each of said cell MOS transistors includes a channel having a channel width, and wherein a resistance of each said resistive element is selected so that a range between upper and lower limits of a channel width of said cell MOS transistors required to set a value of a data write time with respect to said cell MOS transistors smaller than a predetermined value in substantially maximized.

5. A memory according to claim 1, further comprising switching elements provided electrically parallel to said resistive elements to be turned on when data is read out from said cell MOS transistors.

6. A nonvolatile semiconductor memory comprising:

a memory cell array divided into at least two blocks, each of said divided blocks including data memory cell MOS transistors; and resistive components, respectively provided in said blocks, for connecting sources of said cell MOS transistors commonly connected in each of said blocks to one end of a power source circuit of memory, wherein each of said cell MOS transistors includes a control gate electrode having a gate width, wherein each of said resistive components has a width corresponding to said gate width of said control gate electrodes of said cell MOS transistors and is formed of the same material as that of said control gate electrodes of said cell MOS transistors.

7. A memory according to claim 6, wherein each said resistive component has a width substantially the same as a width of said control gate electrodes of said cell MOS transistors.

8. A memory according to claim 6, wherein each of said cell MOS transistors includes a channel having a channel width, and wherein a resistance of each said resistive component is selected so that a range between upper and lower limits of a channel width of said cell MOS transistors required to set a value of a data write time with respect to said cell MOS transistors smaller than a predetermined value is substantially maximized.

9. A memory according to claim 6, further comprising:

switching elements provided electrically parallel to said resistive elements to be turned on when data is read out from said cell MOS transistors.

10. A memory according to claim 7, further comprising:

switching elements provided electrically parallel to said resistive elements to be turned on when data is read out from said cell MOS transistors.

11. A memory according to claim 8, further comprising:

switching elements provided electrically parallel to said resistive elements to be turned on when data is read out from said cell MOS transistors.

12. A nonvolatile semiconductor memory comprising:

a memory cell array divided into a plurality of blocks, each of said divided blocks including data memory cell MOS transistors arranged in a matrix form and write circuits for sending write data to said cell MOS transistors; and resistive elements, in said plurality of blocks, for connecting sources of said cell MOS transistors commonly connected in each of said plurality of blocks to one end of a power circuit of said memory, wherein each said resistive element has a width corresponding to a channel width of said cell MOS transistors and is formed of the same material as that of a control gate electrode of each of said cell MOS transistors.

13. A memory according to claim 12, wherein a width of each of said resistive elements corresponds to a width of said control gate electrodes.

14. A memory according to claim 12, wherein a resistance of each said resistive element is selected so that a range between upper and lower limits of a channel width of said cell MOS transistors required to set a value of a data write time with respect to said cell MOS transistors smaller than a predetermined value is substantially maximized.

15. A memory according to claim 12, further comprising switching elements provided electrically parallel to said resistive elements to be turned on when data is read out from said cell MOS transistors.

16. A nonvolatile semiconductor memory comprising:

a memory cell array divided into a plurality of blocks, each of said divided blocks including data memory cell MOS transistors arranged in a matrix form and write circuits for sending write data to said cell MOS transistors; and resistive elements, in said plurality of blocks, for connecting sources of said cell MOS transistors commonly connected in each of said plurality of blocks to one end of a power circuit of said memory, wherein a resistance of each said resistive element is selected so that a range between upper and lower limits of a channel width of said cell MOS transistors required to set a value of a data write time with respect to said cell MOS transistors smaller than a predetermined value is substantially maximized.

17. A memory according to claim 16, wherein a width of each of said resistive elements corresponds to a width of a control gate electrode of each of said cell MOS transistors.

18. A memory according to claim 16, wherein each said resistive element has a width corresponding to a channel width of said cell MOS transistors and is formed of the same material as that of a control gate electrode of each of said cell MOS transistors.

19. A memory according to claim 16, further comprising switching elements provided electrically parallel to said resistive elements to be turned on when data is read out from said cell MOS transistors.

20. A nonvolatile semiconductor memory comprising:

a memory cell array divided into a plurality of blocks, each of said divided blocks including data memory cell MOS transistors arranged in a matrix form and write circuits for sending write data to said cell MOS transistors;

resistive elements, independently provided in said plurality of blocks, for connecting sources of said cell MOS transistors commonly connected in each of said plurality of blocks to one end of a power circuit of said memory; and switching elements provided electrically parallel to said resistive elements to be turned on when data is read out from said cell MOS transistors.

21. A memory according to claim 20, wherein a width of each of said resistive elements corresponds to a width of a control gate electrode of each of said cell MOS transistors.

22. A memory according to claim 20 wherein each said resistive element has a width corresponding to a channel width of said cell MOS transistors and is formed of the same material as that of a control gate electrode of each of said cell MOS transistors.

23. A memory according to claim 20, wherein a resistance of each said resistive element is selected so that a range between upper and lower limits of a channel width of said cell MOS transistors required to set a value of a data write time with respect to said cell MOS transistors smaller than a predetermined value is substantially maximized.

* * * * *

UNITED STATES PATENT AND TRADEMARK OFFICE
CERTIFICATE OF CORRECTION

PATENT NO. : 4,897,815
DATED : January 30, 1990
INVENTOR(S) : Sumio Tanaka et al.

It is certified that error appears in the above-identified patent and that said Letters Patent is hereby corrected as shown below:

Claim 2, Column 6, Line 46, change "gage" to --gate--;

Claim 4, Column 6, Line 63, change "in" to --is--.

Signed and Sealed this

Ninth Day of June, 1992

Attest:

DOUGLAS B. COMER

*Attesting Officer*   *Acting Commissioner of Patents and Trademarks*